(12) United States Patent
Ruan et al.

(10) Patent No.: US 7,745,335 B2
(45) Date of Patent: Jun. 29, 2010

(54) SEMICONDUCTOR DEVICE MANUFACTURED BY REDUCING HILLOCK FORMATION IN METAL INTERCONNECTS

(75) Inventors: Ju-Ai Ruan, Plano, TX (US); Changming Jin, Plano, TX (US); Sopa Chevacharoenkul, Richardson, TX (US); Satyavolu Papa Rao, Garland, TX (US); Tae Seung Kim, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 536 days.

(21) Appl. No.: 11/614,511

(22) Filed: Dec. 21, 2006

(65) Prior Publication Data
US 2008/0150131 A1    Jun. 26, 2008

(51) Int. Cl.
*H01L 21/4763* (2006.01)
*H01L 21/44* (2006.01)
*B05D 3/00* (2006.01)

(52) U.S. Cl. .................. 438/687; 438/627; 438/628; 438/660; 438/937; 427/299

(58) Field of Classification Search .............. 438/937
See application file for complete search history.

(56) References Cited

U.S. PATENT DOCUMENTS

| | | | | |
|---|---|---|---|---|
| 6,346,489 B1 * | 2/2002 | Cohen et al. | ................ | 438/789 |
| 6,764,951 B1 * | 7/2004 | van Ngo | ................... | 438/687 |

* cited by examiner

*Primary Examiner*—Ha Tran T Nguyen
*Assistant Examiner*—Valerie Brown
(74) *Attorney, Agent, or Firm*—Warren L. Franz; Wade J. Brady, III; Frederick J. Telecky, Jr.

(57) ABSTRACT

A method of fabricating an interconnect structure, comprising exposing an empty deposition chamber to a process that includes generating reactive species produced from a source gas in the presence of a plasma. The method further comprises terminating the plasma and then introducing a semiconductor substrate with a metal layer thereon into the chamber while the reactive species are present in the chamber.

10 Claims, 8 Drawing Sheets

SEMICONDUCTOR DEVICE MANUFACTURED BY REDUCING HILLOCK FORMATION IN METAL INTERCONNECTS

TECHNICAL FIELD

This disclosure is directed, in general, to semiconductor devices such as integrated circuits and their method of manufacture, and more specifically, to the fabrication of metal interconnect structures.

BACKGROUND

Metal interconnects are used to electrically connect semiconductor devices, such as capacitors or transistors. Unfortunately, situations arise where a problem in fabrication results in a faulty or defective interconnect. For instance, during certain integrated circuit (IC) fabrication schemes, there are steps that can cause the formation of surface discontinuities on the interconnect known as hillocks.

The term hillock as used herein refers to an unintended metal structure that protrudes above the surface of the metal interconnect. The presence of hillocks on copper interconnects is associated with both a reduced IC yield and reliability. E.g., hillocks can promote the formation of short circuits in interconnect structures where an interconnect lands on top of an underlying interconnect having surface hillocks.

Accordingly, what is needed is a method for manufacturing ICs, and ICs formed therefrom, that includes fabricating interconnect structures that avoids or reduces the formation of hillocks.

SUMMARY

One embodiment comprises exposing an empty deposition chamber to a process that includes generating reactive species produced from a source gas in the presence of a plasma. The method also comprises terminating the plasma and then introducing a semiconductor substrate with a metal layer thereon into the chamber while the reactive species are present in the chamber.

Another embodiment comprises a method of manufacturing an integrated circuit. The method comprises fabricating an interconnect structure. Fabricating the interconnect structure includes depositing an inter-layer dielectric layer over a semiconductor device located in or on a semiconductor wafer. An opening is formed in the inter-layer dielectric layer and the opening is filled with a copper layer. Fabricating the interconnect structure further includes pre-charging an empty chamber using a first process that includes generating first reactive species produced from a first source gas in the presence of a first plasma. The first plasma is terminated and the semiconductor wafer with the copper layer is introduced into the chamber while the reactive species are present in the chamber. Fabricating the interconnect structure also includes further treating the semiconductor wafer with the copper layer using a second process that includes generating second reactive species produced from a second source gas in the presence of a second plasma. After terminating the second plasma, an etch stop layer is deposited on the copper layer.

Another embodiment is directed to an integrated circuit. The integrated circuit comprises semiconductor devices located on or in a semiconductor substrate, and contacts in a pre-metal dielectric layer located over the semiconductor substrate, wherein the contacts are coupled to the semiconductor devices. The integrated circuit also comprises interconnects in inter-layer dielectric layers located over the semiconductor substrate, the interconnects being coupled to the contacts. A surface of at least one of the interconnects is protected from hillock formation by exposing an empty deposition chamber to a process that includes generating reactive species produced from a source gas in the presence of a plasma before terminating the plasma and introducing the semiconductor substrate into the chamber while the reactive species are present in the chamber.

DETAILED DESCRIPTION

In one aspect, it has been found that hillock formation could be mitigated by producing reactive species in the chamber both before and after the introduction of the substrate into the chamber. The generation of reactive species in a chamber just prior to introducing a substrate into the chamber has not previously been recognized as a result effective variable that can influence the yield and reliability of interconnects fabricated, at least in part, in the chamber.

While not limiting the scope of the invention by theory, it is believed that having reactive species in the chamber before the substrate is introduced into the chamber facilitates the rapid removal of residual oxide or organic layers on the surface of metal interconnects located on the substrate. It is further believed that interconnect yield and reliability are improved by removing at least some of the residual layers before the metal interconnect gains sufficient kinetic energy, imparted by a plasma or heating, to form seed regions for hillocks.

Figure 1:
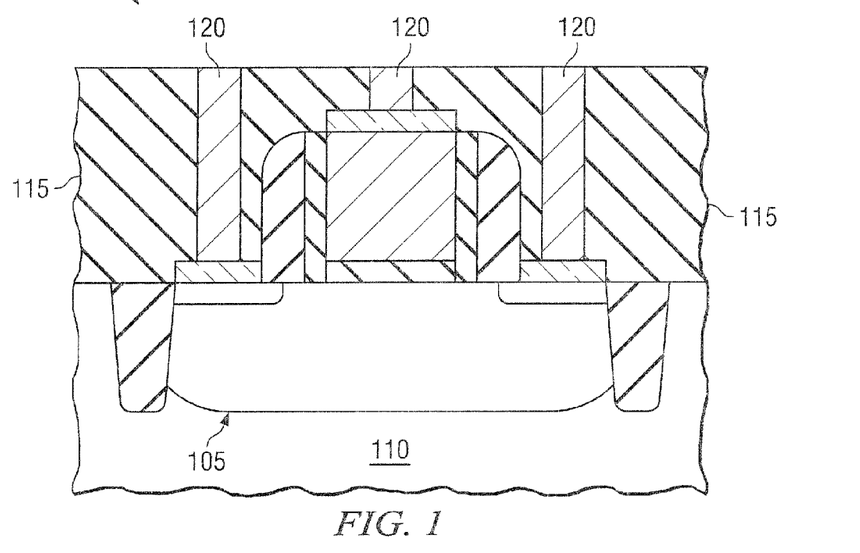
FIGS. 1 to 8 illustrate cross-sectional views of selected steps in an example implementation of a method of manufacturing an integrated circuit that includes fabricating an interconnect of the invention.

One embodiment is directed to a method of fabricating an interconnect. The interconnect's fabrication can be part of another embodiment of manufacturing an IC. FIGS. 1-8 show cross-sectional views of selected steps in an example method of manufacturing an IC 100 that includes fabricating an interconnect. As shown in FIG. 1, the IC 100 comprises conventionally formed semiconductor devices 105 (e.g., one or more nMOS and pMOS transistors or capacitors) located in or on a semiconductor substrate 110 (e.g., a silicon wafer), a pre-metal dielectric (PMD) layer 115 (e.g., phosphosilicate glass), and one or more contacts 120 (e.g., a tungsten or other metal contact) coupled to the device 105 and located over the substrate 110.

FIGS. 2-7 show selected steps in an example fabrication of an interconnect 200. The term interconnect as used herein refers to all types of metal wiring in a layer, including metal lines, vias, trenches, contacts or other conventional wiring. Although the interconnect fabrication process can be applied to mitigate the formation of hillocks in any sized interconnect, it is especially applicable in the fabrication interconnects that comprise wide structures (e.g., lines or trenches) having a large surface area of metal (e.g., about 100 micron$^2$ or greater) because such surfaces are more prone to hillock formation. Although the examples to follow illustrate and discuss fabricating single or dual damascene copper interconnects, the method can also be applied to the fabrication of other types of conventional interconnect structures and other materials (e.g., aluminum, gold or other metal interconnects), if desired.

Figure 2:
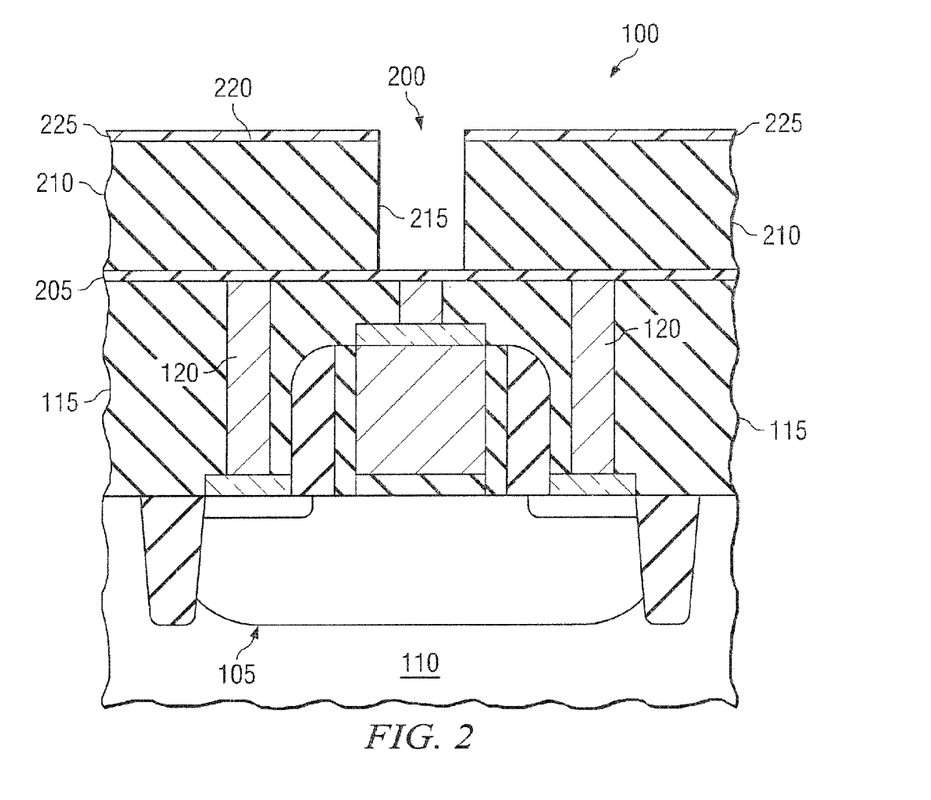

FIG. 2 shows the IC 100 after forming an etch stop layer 205 on the underlying PMD layer 115 and contact 120. The etch stop layer 205 helps limit the undesired etching of the PMD layer 115 and contact 120 during a subsequent etching step to form an interconnect. The etch stop layer 205 can be deposited using plasma-enhanced chemical vapor deposition (PECVD) or other procedures well known to those skilled in the art. Some etch stop materials include silicon carbide (SiC), silicon nitride (SiN), silicon carbon nitride (SiCN), silicon oxycarbon (SiCO), or combined layers thereof.

Forming the interconnect 200 includes depositing an interlayer dielectric (ILD) layer 210 (FIG. 2) over the semiconductor devices 105. The ILD layer 210 can comprise silicon oxide, fluorosilicate glass (FSG), or other low dielectric constant materials, including multilayered dielectric materials. The ILD layer 210 can be deposited using PECVD or other conventional procedures. FIG. 2 shows the IC 100 after forming an opening 215 in a surface 220 of the ILD layer 210. The opening 215 (e.g., a single damascene opening) can be formed by conventional lithographic and etching processes down to the etch stop layer 205. The interconnect opening 215 can be located over the semiconductor substrate 110. The interconnect opening 215 can be directly over one of the underlying contacts 120. To limit excessive etching of the target ILD layer 210, or to limit the damage to the ILD layer 210 during a resist patterning rework, it is sometimes desirable to deposit and pattern a hardmask 225 on the surface 220. The hardmask 225 can comprise, e.g., silicon carbide deposited by PECVD. However, other hardmask materials and deposition procedures well known to those skilled in the art can be used.

Figure 3:
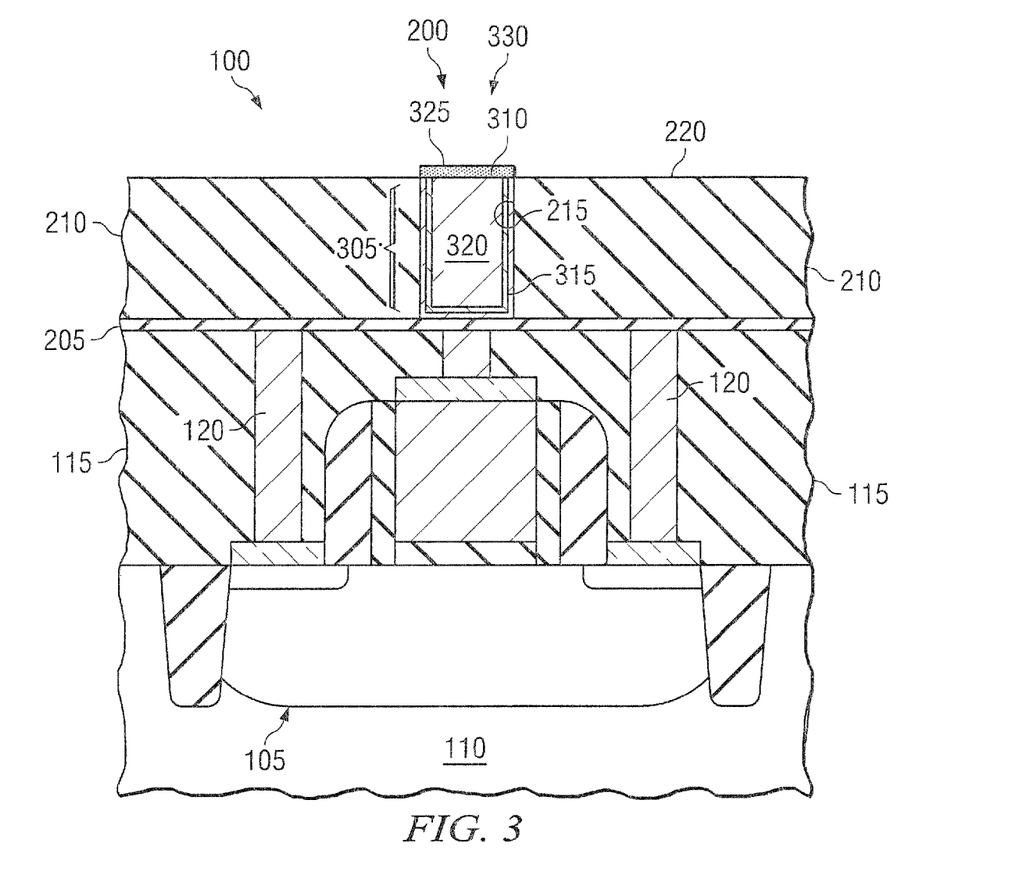

FIG. 3 shows the IC 100 after filling the interconnect opening 215 with a metal layer 305 using materials and procedures well known to those skilled in the art. E.g., forming the metal layer 305 can comprise a CVD or PVD deposited barrier layer 310 (e.g., tantalum nitride, TaN) and seed layer 315 (e.g., Cu), and an electrochemically deposited interior metal layer 320 (e.g., Cu). FIG. 3 shows the IC 100 after removing any excess metal deposited on the ILD's surface 220 outside of the opening 215, using conventional planarization processes, such as chemical mechanical polishing (CMP). As further illustrated in FIG. 3, there can be a residual layer 325 comprising metal oxide (copper oxides) or organic compounds (e.g., CMP corrosion inhibitors, such as benzotriazine) on the metal layer's surface 330, formed as a consequence of the planarization procedure. It is desirable to remove the residual layer 325 to facilitate the adhesion of a subsequently deposited material layer (e.g., an etch stop layer) to the metal layer 305.

Figure 4:
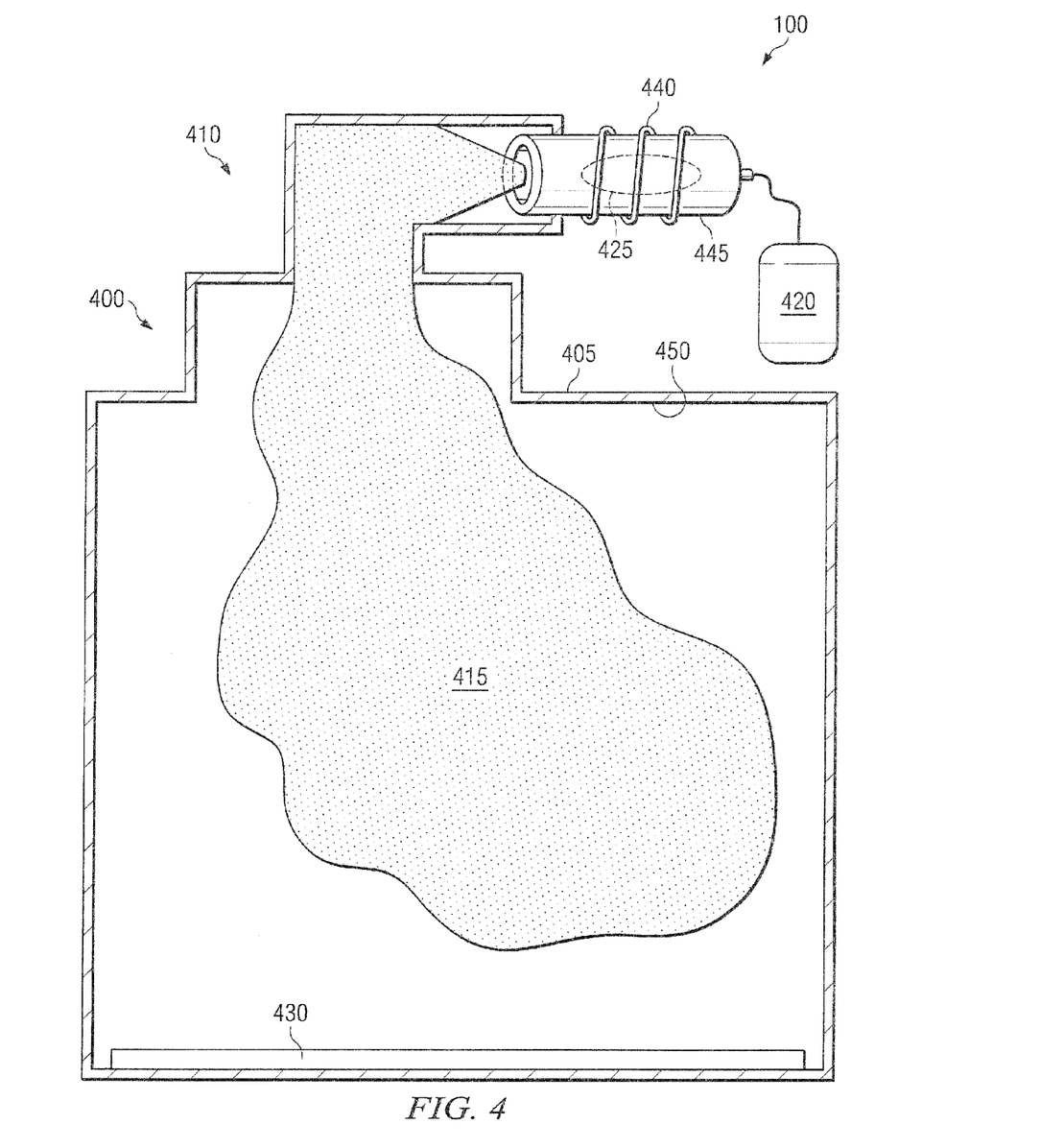

FIG. 4 shows a deposition tool 400 having an empty chamber 405 while being exposed to a process 410 (in some cases, a first process) that includes generating reactive species 415 produced from a source gas 420 in the presence of a plasma 425 (in some cases a first reactive species, first source gas and first plasma). The generation of reactive species 415 in the chamber 405 before introducing the substrate 110 into the chamber 405 is referred to herein as pre-charging the chamber 405.

The chamber 405 can be a component of a deposition tool 400, such as a plasma enhanced chemical vapor deposition (PECVD) tool. The chamber 405 can have a substrate station 430 to accommodate a substrate or multiple stations. The tool 400 can be used to deposit various material layers including IDL layers, etch stop layers, or hardmask layers.

The reactive species 415 can be generated by introducing the source gas 420 into the chamber 405 and then turning on the plasma 425. The plasma 425 can be produced in an inductively coupled radio-frequency plasma source comprising e.g., a coil 440 wrapped around a ceramic tube 445. In other instances, the plasma 425 comprises a microwave plasma. However, any plasma capable of generating the reactive species 415 can be used.

The term reactive species 415 as used herein refers to chemical compounds that are capable of reacting with the residual layer 325 located on the metal layer's surface 330 (FIG. 3), which allows the removal of the residual layer 325. The reactive species 415 generated in the chamber 405 at the stage depicted in FIG. 4, have not yet reacted with the residual layer 325 because the chamber 405 is empty. That is, the chamber 405 at this stage in the method does not contain the semiconductor substrate 110.

In some cases, the reactive species 415 includes free radicals produced from a source gas 420 that includes one or more reactive gases such as $NH_3$, $N_2$, or $H_2$. The source gas 420 can include inert gases (e.g., He) as a dilutant of the reactive gases. In some cases, the conditions of the process 410 are held constant throughout the process (e.g., a single step process). In other cases, the conditions of the process 410 are varied by changing, e.g., the ratios of different gases comprising the source gas 420, the plasma power, or the chamber temperature (e.g., multiple step process).

In one embodiment, the source gas 420 is free of fluorine or oxygen-containing gases because these gases can generate species that undesirably react with (e.g., oxidize) and remove the metal layer 305, IDL layer 210, or other material layers on the substrate 110, or alternatively deter the removal of a residual layer 325 comprising a metal oxide. E.g., in some embodiments the source gas 420 does not contain, e.g., fluorocarbon or oxygen gases such as used in chamber cleaning processes designed to remove silicon dioxide and other deposits that build up over time in the chamer's 405 interior 450.

In some embodiments, the interior 450 of the empty chamber 405 during the process 410 has a temperature ranging from about 100 to 500° C. at the substrate station 430 where the IC 100 would be located in subsequent processing steps. In some cases, a temperature range of less than 300° C. is advantageous because less energy is expended to pre-charge the chamber 405. In other cases, a temperature range of about 300 to 400° C. is advantageous because this is at or close to the temperature used in a subsequent material layer deposition process, thereby obviating the need to further adjust the chamber's temperature. In still other cases, a temperature of greater 400° C. may be used to increase the rate of removal of the residual layer 325.

For example, in some cases the process 410 comprises introducing a source gas 420 of about 100 to 2000 sccm and in some cases about 400 to 900 sccm, of $NH_3$ into the chamber 405 having an inductively coupled plasma 425 produced using a radio-frequency power setting of about 300 Watts, a chamber pressure of about 3 Torr and a chamber temperature of about 350° C. In one embodiment, it is desirable for the plasma 425 to be on long enough (e.g., at least about 1 second, and in some cases at least about 10 seconds) for the reactive species 415 to equilibrate throughout the chamber 405. One skilled in the art would understand how the gas flow, plasma power, chamber pressure, and time conditions for the process 410 could be varied from those stated above.

Figure 5:
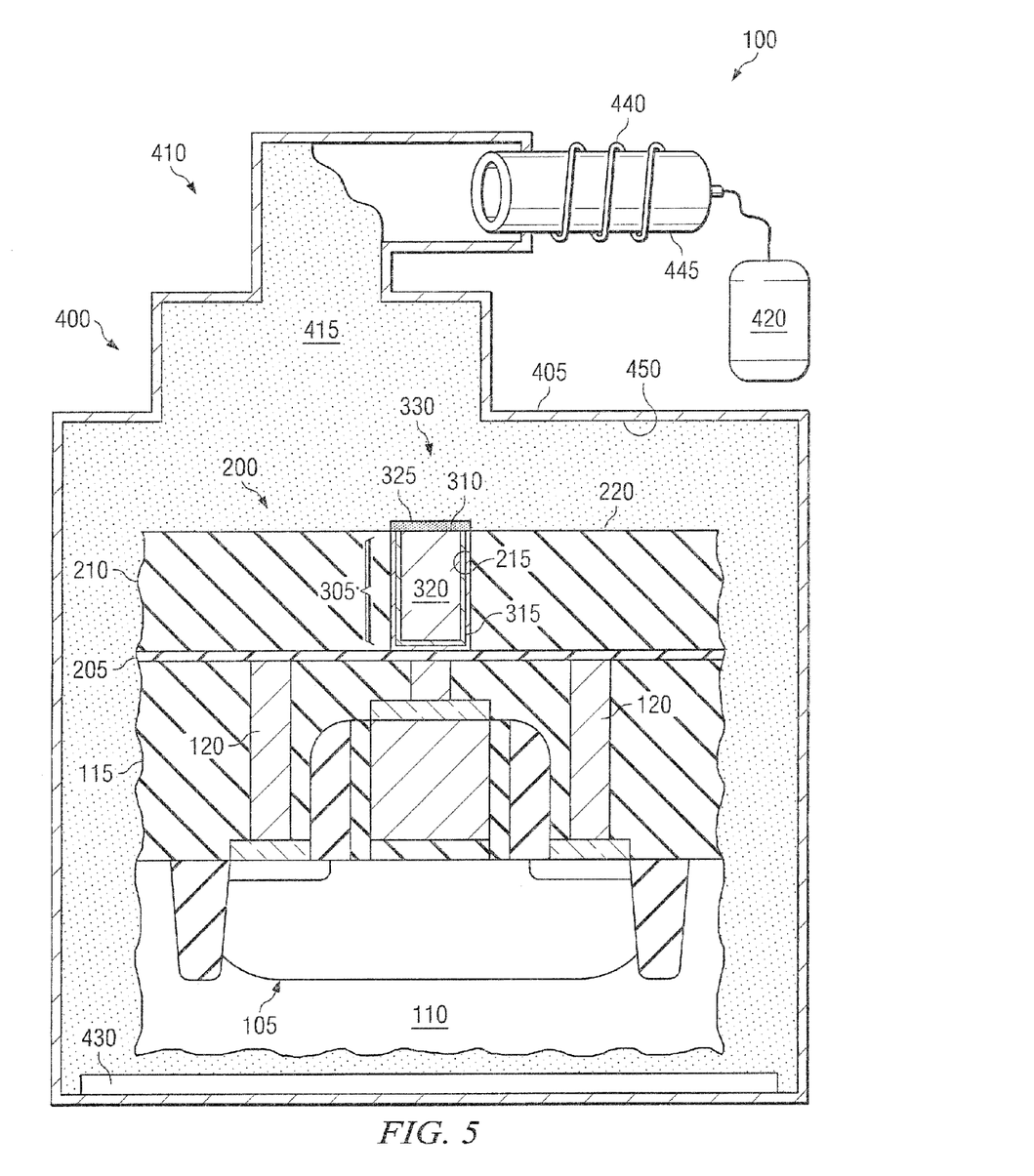

FIG. 5 shows the chamber 405 after terminating the plasma 425 (FIG. 4), and then introducing the IC 100 (e.g., the semiconductor substrate 110 with the metal layer 305 thereon) into the chamber 405, while the reactive species 415 are still present in the chamber 405. The plasma 425 (FIG. 4) is terminated before introducing the substrate 110 into the chamber 405 so that the plasma 425 will not become unstable and arc, thereby damaging the substrate 110 or chamber 405. E.g., the plasma 425 is terminated, and then the delivery of source gas 420 to the chamber is stopped, and the chamber 405 is allowed to reach a pressure (300-500 mTorr) that is approximately the same as that of a transfer chamber holding the substrate 110.

In one embodiment, the substrate 110 is introduced into the chamber as soon as possible, and in another embodiment, immediately with no intervening steps, after terminating the plasma 425 because the reactive species 415 have a short lifetime. If the transition time is too long, then the concentration of reactive species 415 will be insufficient to remove all, or in some cases any, of the residual layer 325. E.g., in some embodiments, a transition time between terminating the plasma 425 and introducing the semiconductor substrate 110 into the chamber 405 is about 60 seconds or less. When short transition times are used, a higher amount of reactive species 415 will be present in the chamber 405 to react with the residual layer 325. E.g., in some cases, the transition time is about 15 seconds or less, and in some cases about 8 seconds or less, and in some cases about 5 seconds or less. Of course, those skilled in the art will realize that the times may vary depending on the tool that is used, etc.

Figure 6:
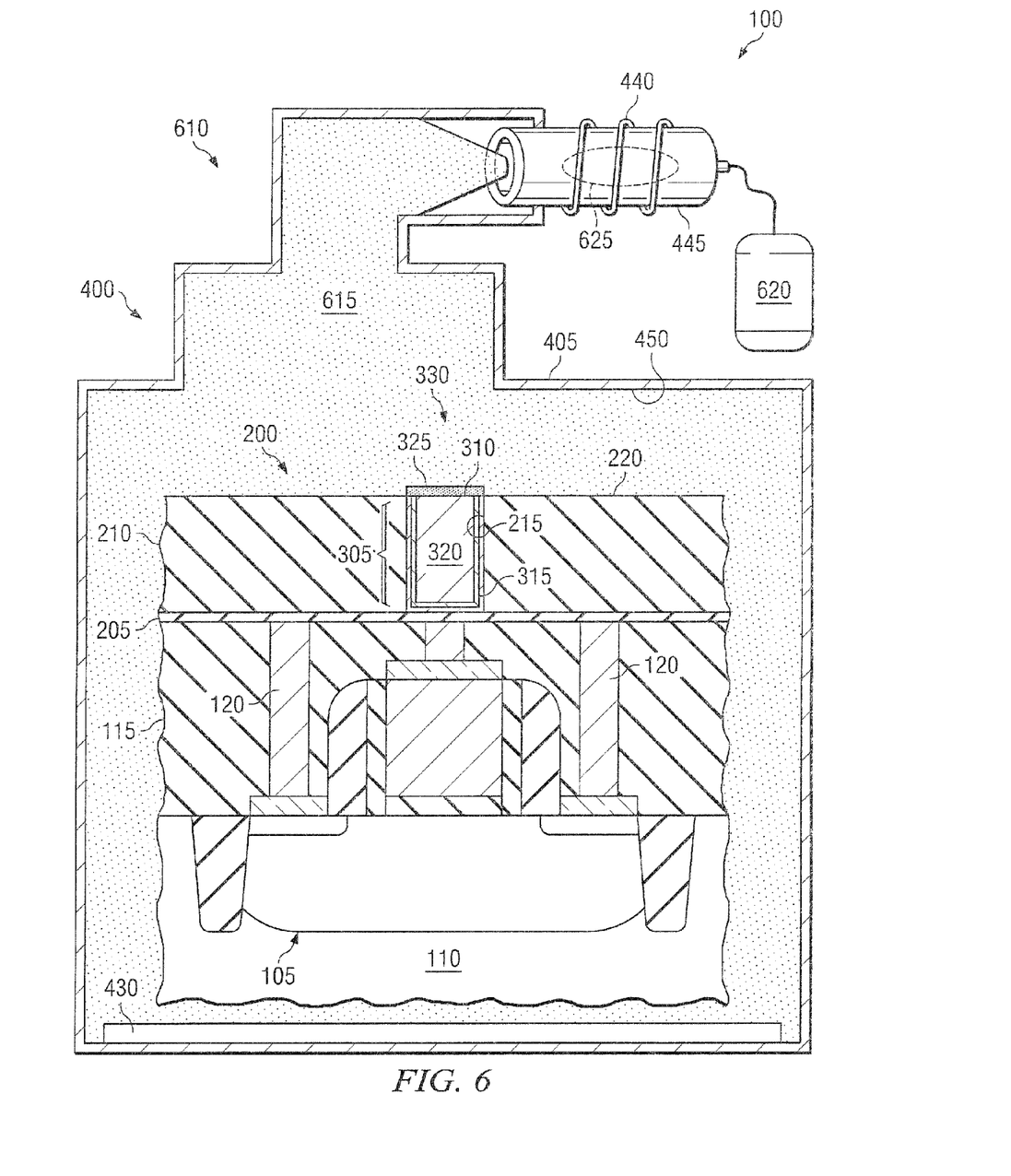

FIG. 6 shows the IC 100 while further treating the metal layer 305 with a second process 610 that includes generating a second reactive species 615 produced from a second source gas 620 in the presence of a second plasma 625. A second process 610 may be used in those embodiments where the reactive species 415 do not fully remove the residual layer 325 (FIG. 5). While the first and second processes 410, 610 could be carried out in different chambers, the same chamber 405 may be used so that the residual layer 325 does not reform when transferring the substrate 110 to another chamber, or to reduce the time or costs of carrying out the process 610.

In some cases, the second process 610 is the same as the first process 410. E.g., same type and amount of source gases, plasma power, and temperature can be used for both processes 410, 610. However, in other embodiments, the two processes 410, 610 are different. For instance, because the reactive species 415 are generated in the absence of the substrate 110, the first process 410 (FIG. 4) can have harsher conditions than the second process 610 (FIG. 6). E.g., the presence of an inert gas in the sources gas 420 of the first process 410 is sometimes not needed, and a chamber 405 temperature of about 400° C. or higher is acceptable. However, for some second processes 610, the source gas 620 includes inert gases, and the chamber's 405 temperature is about 400° C. or lower.

In some embodiments, the second reactive species 615 includes free radicals produced from the second source gas 620 that includes one or more reactive gases of $NH_3$, $N_2$, or $H_2$ (e.g., about 100 to 2000 scam) plus an inert gas such as He (e.g., about 100 to 2000 scam). The inclusion of an inert gas helps to protect the substrate 110 from damage by the reactive species 615. E.g., in some cases, the second source gas 620 includes about 900 scam of $NH_3$ and about 400 scam of He. Temperatures of 400° C. or lower are desirable to minimize the thermal budget that the IC is exposed to and to further mitigate hillock formation.

In some cases, the first reactive species 415 are still present when the second process 610 is started and the second reactive species 615 are generated. E.g., in some embodiments, the delay time between introducing the substrate 110 into the chamber 405 and starting the second process 610 is less than about 60 seconds, and in some cases about 15 seconds or less. In other embodiments the substrate is transferred to another tool or chamber where the second process 610 is performed. In some embodiments, the second process 610 is continued for about 10 to 60 seconds to facilitate complete removal of the residual layer 325.

Figure 7:
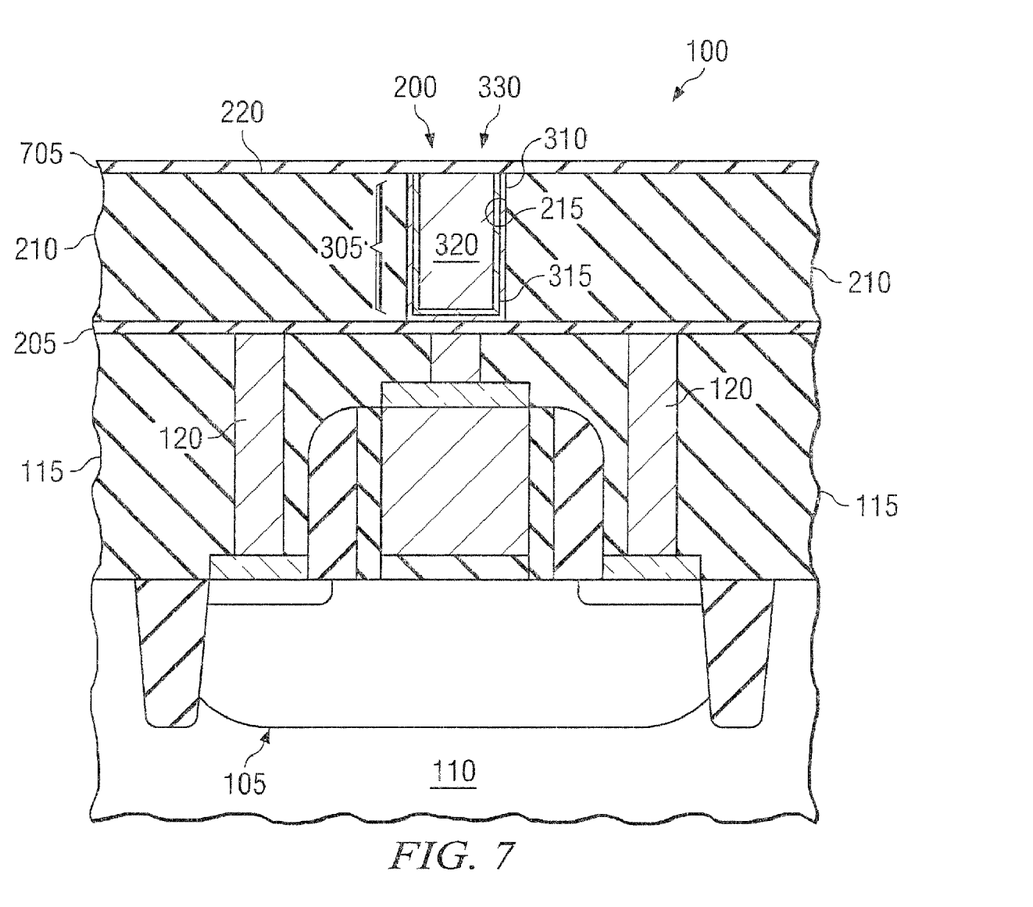

FIG. 7 shows the IC 100 after terminating the second plasma 625 and then depositing a material layer 705 on the metal layer 305. In some cases the material layer 705 is deposited in the same tool 400 and chamber 405 as used for the first and second processes 410, 610 (FIG. 4-6), although a different tool or chamber could be used. In some cases the material layer 705 can be an etch stop layer comprising the same type of materials and deposited in the same fashion as discussed for the etch stop layer 205 (FIG. 2). E.g., to form a silicon carbon nitride etch stop layer 705, after terminating the second plasma 625 (FIG. 6), the source gas is adjusted to include ammonia plus trimethylsilane, and the plasma is adjusted to settings that facilitate silicon carbon nitride deposition. However, the material layer 705 could comprise any material deposited on the metal layer 305 following the layer's 305 planarization, where the material deposition process is capable of promoting hillock formation. Other example material layers include silicon nitride, silicon carbide, or a very thin layer of silicide (e.g., Cu silicide when metal layer 305 comprises Cu).

Figure 8:
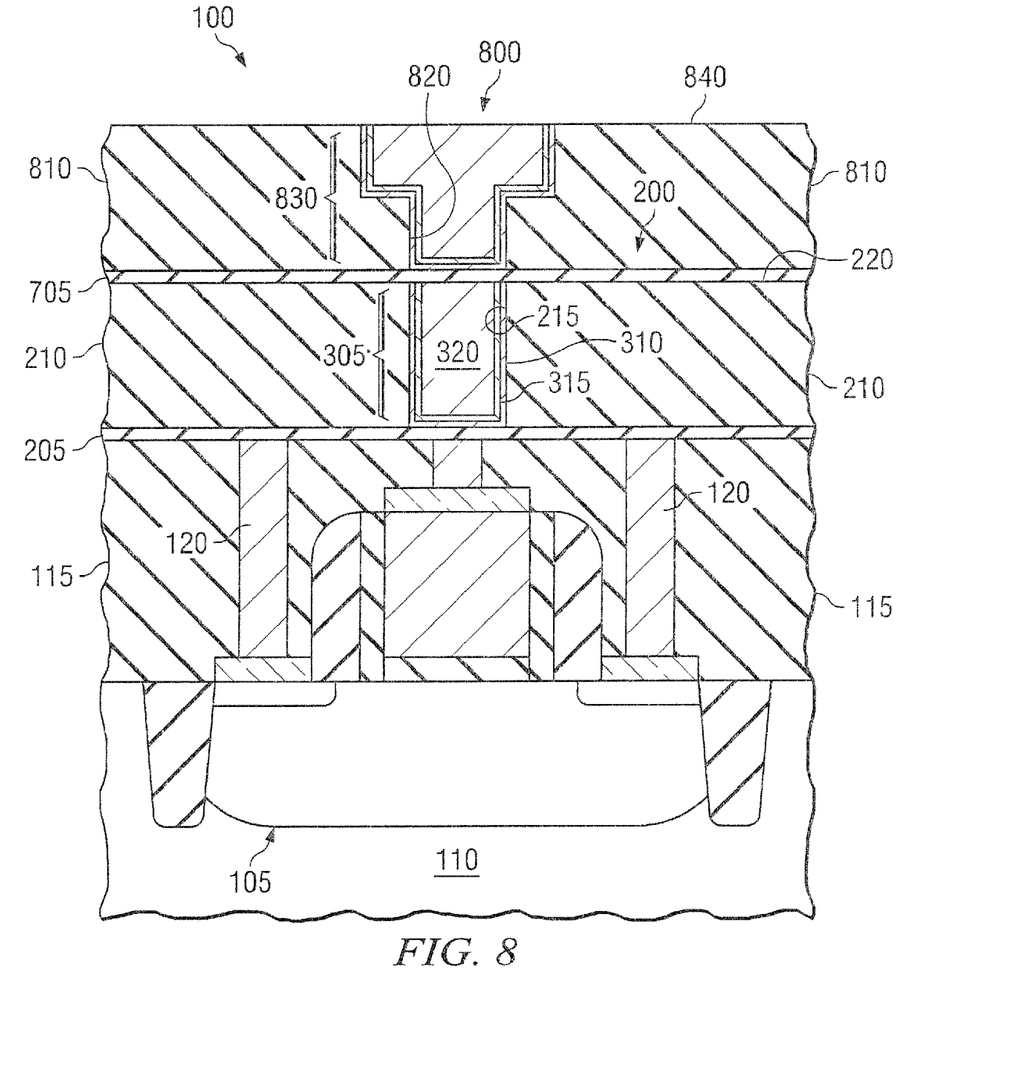

The fabrication process discussed above in the context of FIGS. 2-7 can be repeated to form a plurality of metal layers comprising interconnect structures or each metal-containing layer of the IC 100. E.g., FIG. 8 shows the IC 100 after fabricating a second interconnect structure 800 (e.g., a dual damascene interconnect) using substantially the same process as used to fabricate the interconnect structure 200 discussed in the context of FIGS. 2-7. E.g., fabricating the second interconnect structure 800 can include: depositing a second ILD layer 810 over the etch stop layer 705, forming a second opening 820 in the second ILD layer 810 down to the etch stop layer 705; filling the opening with a second metal layer 830 (e.g., barrier layer, Cu seed layer and interior Cu layer); and planarizing the ILD's surface 840 to remove any excess metal from outside of the opening 820. Before forming additional interconnect-containing layers of the IC 100, the first process 410, and in some cases the second process 610 in addition to the first process 410, can be performed to mitigate hillock formation.

One skilled in the art would appreciate that the method of manufacturing the IC 100 can include additional processes. For instance, it can be desirable to subject the chamber 405 (FIG. 4) to a cleaning process after performing the above-described interconnect fabrication process on one to several different substrates 110. The chamber cleaning process is configured to remove excessive amounts of deposits (e.g., silicon dioxide and silicon carbide) that build up over time on interior surfaces of the chamber and that could fall on the IC 100. The chamber can be cleaned using a cleaning gas containing fluorine and oxygen, such as nitrogen trifluoride ($NF_3$), oxygen ($O_2$) alone or in combination with fluorocarbon gas (e.g., $O_2/CF_4$ and $O_2/C_2F_6$) and inert gas (e.g., Ar). After cleaning the chamber, it is desirable to then season the chamber to help ensure the reproducible deposition of material layers on the substrate. Seasoning the chamber refers to subjecting the chamber to one or more material layer deposition processes so that interior surfaces of the chamber walls become coated with the material layer. E.g., the seasoning process can comprise the deposition of silicon carbon nitride, silicon oxide, or silicon nitride in the chamber.

Figure 9:
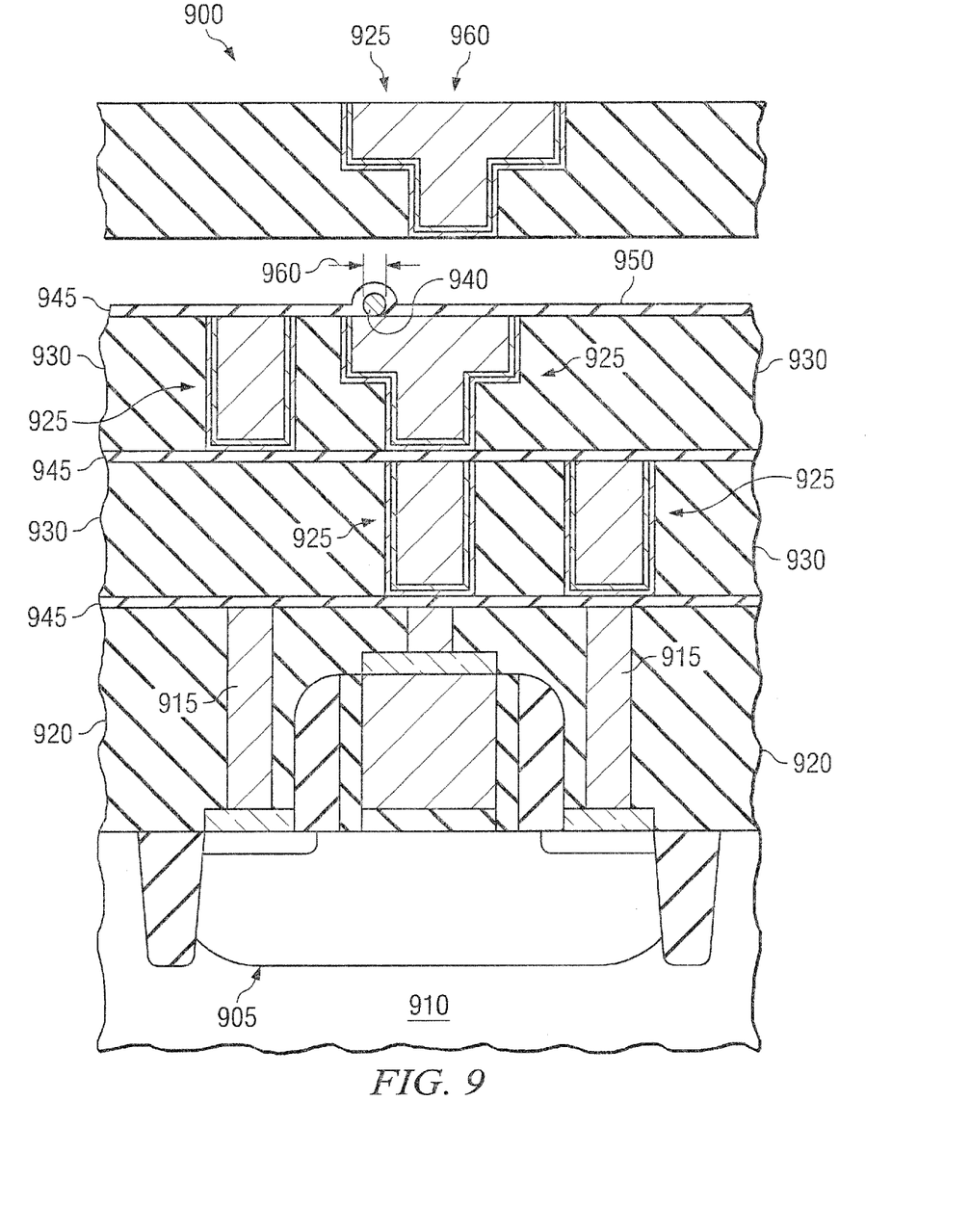
FIG. 9 shows a cross-sectional view of an example integrated circuit of the invention.

FIG. 9 shows a cross-sectional view of another embodiment of the invention, an IC 900. Any of the processes discussed above can be used to manufacture the IC 900.

The IC 900 comprises semiconductor devices 905 on or in a semiconductor substrate 910 and contacts 915 in a pre-metal dielectric layer 920 located over the substrate 910, the contacts 915 being coupled to the devices 905. The IC 900 also includes one or more interconnects 925. The interconnects 925 are located in inter-layer dielectric layers 930 that are located over the substrate 910. The interconnects 925 are coupled to the contacts 915 either directly or indirectly through other interconnects 925.

At least one of the interconnects 925 is protected from hillock 940 formation by exposing an empty deposition chamber to a process, analogous to that described in the context of FIG. 4, to pre-charge a chamber. E.g., the process 410 generates reactive species 415 produced from a source gas 420 in the presence of a plasma 425 before terminating the plasma 425 (FIG. 4). The substrate 910 is then introduced into the chamber 405 while the reactive species 415 are present in the chamber 405 (e.g., FIG. 5). The transition time between terminating the plasma 425 and introducing the semiconductor substrate 910 into the chamber 405 is brief; e.g., about 60 seconds or less and in some cases about 15 seconds or less. In some cases the substrate 110 is then subjected to the second process 610 (FIG. 6).

Hillocks 940 can compromise the integrity of a material layer 945 (e.g., an etch stop layer) subsequently formed on the interconnect's 950 upper surface. E.g., the material layer 945 can be compromised by allowing excessive etching in the vicinity of a hillock 940 located on a metal interconnect 925 during a subsequent etching step to form an interconnect opening 960 over the interconnect 925. Excessive etching through the compromised material layer 945, in turn, can create an interconnect short-circuit that causes the IC 900 to malfunction.

In some embodiments, at least one, and preferably each, interconnect's 925 surface 950 is treated with the process 410 (FIG. 4), and in some cases second process 610, and is thereby substantially free of hillocks 940. In some cases, the interconnect's surface 950 is additionally treated with the second process 610 (FIG. 6). The term substantially free of hillocks as used herein refers to a density of hillocks 940 equal to about one or less hillock per 1000 micron$^2$ area of the interconnect's surface 950. The size and density of hillocks 940 can be detected using conventional surface light scattering or electron scanning microscope methods well known to those skilled in the art.

In some instances, no detectable hillocks are present. In other instances, however, there are detectable hillocks 940 but they are smaller in size than that found in interconnects formed similar to that described above, except without using the process 410 to pre-charge the chamber. E.g., in some embodiments, the hillocks 940 have a diameter 960 of about 100 nm or less. If the hillock's 940 size is reduced sufficiently, then the integrity of the material layer 945 is not compromised by a subsequent etching step.

Those skilled in the art to which the invention relates will appreciate that other and further additions, deletions, substitutions and modifications may be made to the described example embodiments, without departing from the invention.

What is claimed is:

1. A method of fabricating an integrated circuit, including the fabrication of an interconnect using a damascene process, the method comprising:
   forming a pre-metal dielectric layer over a semiconductor device formed on a substrate;
   forming a contact for electrical connection to the device through the pre-metal dielectric layer;
   forming an inter-layer dielectric layer over the pre-metal dielectric layer and the contact;
   forming an interconnect opening in the inter-level dielectric layer by etching through a patterned mask down to the contact;
   forming a metal layer over the inter-level dielectric layer and filling the interconnect opening;
   performing a planarization process to remove at least a portion of the metal layer from over the inter-level dielectric layer;
   pre-charging a reaction chamber of a plasma deposition tool without the substrate in the chamber, by generating a first reactive species from a first source gas in the presence of a first plasma at a first temperature; the first source gas including $NH_3$ and the first temperature being higher than 400° C.;
   following planarization, introducing the substrate into the pre-charged chamber, with the first plasma terminated and the first reactive species still present in the chamber;
   with the substrate introduced into the pre-charged chamber, treating the substrate with a second reactive species from a second source gas in the presence of a second plasma at a second temperature; the second source gas including $NH_3$ and He, the second temperature being lower than 400° C., and the second reactive species being started while the first reactive species is still present in the chamber; and
   with the substrate still in the chamber, depositing a layer of silicon carbon nitride over a remaining portion of the metal layer using a third source gas including silicon and carbon components.

2. The method of claim 1, further comprising removing the substrate from the chamber following depositing the layer of silicon carbon nitride; and cleaning the chamber to remove deposits from interior surfaces of the chamber.

3. The method of claim 2, further comprising, following the cleaning, seasoning the chamber by depositing silicon carbon nitride on the interior surfaces.

4. The method of claim 2, wherein the chamber is cleaned using a cleaning gas containing fluorine and oxygen.

5. The method of claim 1, wherein the time between terminating the first plasma and introducing the substrate into the pre-charged chamber is 60 seconds or less.

6. The method of claim 1, wherein the gas having silicon and carbon components comprises trimethylsilane.

7. A method of fabricating an integrated circuit, including the fabrication of an interconnect using a damascene process, the method comprising:
   forming a pre-metal dielectric layer over a semiconductor device formed on a substrate;
   forming a contact for electrical connection to the device through the pre-metal dielectric layer;
   forming an etch stop layer over the pre-metal dielectric layer and the contact;
   forming an inter-layer dielectric layer over the etch stop layer;
   forming and patterning a hardmask over the inter-level dielectric layer;
   forming an interconnect opening in the inter-level dielectric layer by etching through the patterned hardmask;
   forming a metal layer over the inter-level dielectric layer and filling the interconnect opening;
   performing a planarization process to remove at least a portion of the metal layer from over the inter-level dielectric layer;
   pre-charging a reaction chamber of a plasma deposition tool without the substrate in the chamber, by generating a first reactive species from a first source gas in the presence of a first plasma at a first temperature; the first source gas including $NH_3$ and the first temperature being higher than 400° C.;

following planarization, introducing the substrate into the pre-charged chamber, with the first plasma terminated and the first reactive species still present in the chamber;

with the substrate introduced into the pre-charged chamber, treating the substrate with a second reactive species from a second source gas in the presence of a second plasma at a second temperature; the second source gas including $NH_3$ and He, the second temperature being lower than 400° C., and the second reactive species being started while the first reactive species is still present in the chamber; and with the substrate still in the chamber, depositing a layer of silicon carbon nitride over a remaining portion of the metal layer using a third source gas including silicon and carbon components.

8. The method of claim 7, further comprising removing the substrate from the chamber following depositing the layer of silicon carbon nitride; and cleaning the chamber to remove deposits from interior surfaces of the chamber; and, following the cleaning, seasoning the chamber by depositing silicon carbon nitride on the interior surfaces.

9. The method of claim 8, wherein the time between terminating the first plasma and introducing the substrate into the pre-charged chamber is 60 seconds or less.

10. The method of claim 9, wherein the gas having silicon and carbon components comprises trimethylsilane.

* * * * *